United States Patent
Welch et al.

[11] Patent Number: 6,015,196
[45] Date of Patent: Jan. 18, 2000

[54] MODULE MOUNTING SYSTEM

[75] Inventors: Randall Scott Welch, Mission Viejo; Richard Obermeyer, Tustin, both of Calif.

[73] Assignee: Pacific Micro Data, Inc., Irvine, Calif.

[21] Appl. No.: 09/048,720

[22] Filed: Mar. 26, 1998

[51] Int. Cl.[7] .............................. A47B 81/00; H05K 7/00
[52] U.S. Cl. ....................................... 312/223.2; 361/685
[58] Field of Search .............................. 312/223.2, 223.1, 312/334.7, 334.16; 361/685; 248/638, 636

[56] References Cited

U.S. PATENT DOCUMENTS

| | | |
|---|---|---|
| 4,705,257 | 11/1987 | Leo et al. . |
| 4,896,777 | 1/1990 | Lewis . |
| 4,937,806 | 6/1990 | Babson et al. . |
| 5,004,207 | 4/1991 | Ishikawa et al. . |
| 5,216,582 | 6/1993 | Russell et al. . |
| 5,398,821 | 3/1995 | Vansant . |
| 5,463,527 | 10/1995 | Hager et al. . |
| 5,491,608 | 2/1996 | Koyanagi et al. . |
| 5,552,946 | 9/1996 | Bicknese et al. . |
| 5,587,879 | 12/1996 | Spano et al. ............................. 361/685 |
| 5,666,266 | 9/1997 | Katoh et al. ......................... 361/685 X |
| 5,668,697 | 9/1997 | Dowdy ................................... 361/685 |
| 5,682,291 | 10/1997 | Jeffries et al. ................... 312/223.2 X |
| 5,768,099 | 6/1998 | Radloff et al. .......................... 361/685 |
| 5,828,548 | 10/1998 | Chen ................................ 312/332.1 X |
| 5,843,264 | 12/1998 | Mabuchi et al. .................... 248/638 X |

*Primary Examiner*—Peter M. Cuomo
*Assistant Examiner*—Hanh V. Tran
*Attorney, Agent, or Firm*—Merchant & Gould P.C.

[57] ABSTRACT

There is disclosed a system for mounting a computer module, such as a disk drive, hard drive, tape drive, compact disk drive, tape or other similar backup device, etc., in a computer structure, such as a computer chassis or frame, or the like. The system comprises paired guides for attachment to the module, typically in precut openings therein, and a shuttle. The shuttle is adapted to receive the guides in a secure fashion, to retain the module securely therein. The shuttle is designed to be easily mounted in the computer structure, and in particular, by a "two handed" mounting in the computer structure. This system can also be used for "shock mounting" of a computer module, provided the guides are made of a shock absorbing material.

41 Claims, 7 Drawing Sheets

MODULE MOUNTING SYSTEM

FIELD OF THE INVENTION

The present invention relates to systems for mounting computer modules, such as disk drives, tape drives and the like, in computer structures, and additionally, to systems for mounting these computer modules to protect against the potentially damaging effects from shock and vibration.

BACKGROUND OF THE INVENTION

Computer modules (modules), such as disk and tape drives, are commonly installed in computer chassis by first line manufacturers, and customizers and users, when they seek to upgrade their computers. This installation is challenging, for it typically requires "four hands." This installation is referred to as "four hands", for during installation of these conventional systems, a first hand holds the module, a second hand holds a bottom tray or the like, a third hand holds a screw, for attachment of the module to a portion of the chassis or frame, and a fourth hand holds a screwdriver. This is as opposed two hands, and thus, a single person installing the system faces substantial difficulties when attempting to install these conventional systems and corresponding modules themselves.

Many times, the difficulty of installation with screws, results in the installer omitting screws that are difficult to access, or placement of the screws in the module is too loose. Over time, the loose screws may become too loose and/or fall off the module, such that the module is unbalanced and subsequently damaged. This damage is hastened should there be omitted screws.

These conventional mounting systems are typically designed for minimal, if any shock mounting, such that the module would be isolated from the potentially damaging effects from shock, vibrations and the like. When a shock wave is transferred through a module, it may damage the magnetic components therein. This damage to the magnetic components may cause the loss of data, such that it is not recoverable.

With the advance of technology, these modules have become more durable and less prone to shock damage. However, shock mounting may still be desired. This becomes a problem as conventional shock mounting systems, typically retrofitted systems, for these modules are elaborate, complex to install and expensive, to a point where they are not cost effective.

Moreover, it is sometimes desired to remove the module from the computer chassis, and place it on a surface, such as a table or the like, with the module connected to (the computer either operating or off) or disconnected from the computer. This is problematic, as the user must be careful in removing the module from the chassis or frame. However, of greater criticality is that merely placing the module onto the surface, absent enhanced shock protection, increases the potential for shock damage.

SUMMARY OF THE INVENTION

The present invention overcomes the problems of conventional module mounting systems, by providing a module mounting system that requires only "two hands" to install. Installation of this system of the present invention is simple and easy, uses presently existing modules, and can be used with almost all conventional computer chassis or frame and related off-the-shelf hardware. Moreover, the system eliminates reliability problems, for example, mounting failure, associated with loose and/or omitted screws, such that modules can be mounted with long term reliability. The present invention provides for improved standard mounting as well as shock mounting of the module, that is simple and economical. As a result of the present invention, a module can be easily mounted in a computer chassis or frame, such that it is isolated from shock and vibration. The user can also move the module from the computer chassis or frame and a surface outside of the computer chassis or frame, such as a table top, and vice versa if so desired, with the module protected from shock and vibration.

The present invention is directed to a system for mounting a computer module in a computer structure, including the computer chassis or frame. The system includes multiple guides, preferably two pair of guides, for attaching to the computer module, and a shuttle, for receiving the computer module. The shuttle is adapted to receive the guides in a secure fashion, to retain the module securely therein. The shuttle includes mounting structure cooperatingly configured with respect to the predetermined structure in the computer structure, for mounting the shuttle in the computer structure. This mounting typically involves a slidable engagement of the shuttle mounting structure and the predetermined structure of the computer structure. This system can also be used for "shock mounting" of a computer module, provided the guides are made of a shock absorbing material.

The shuttle is preferably formed of two members, a lower or base member and an upper or cover member, although only the lower member is required. At least the lower shuttle member includes oppositely disposed first portions for receiving one pair of guides and oppositely disposed second portions for receiving the other pair of guides, the guides having been placed on the module, typically at predetermined, manufacturer placed openings, although custom openings are also permissible. Latches, positioned proximate at least each of the second portions, function in combination with the respective second portion to retain each of the respective paired guides in the respective second portions.

BRIEF DESCRIPTION OF THE DRAWINGS

The present invention will be described with reference to the accompanying drawings, wherein like reference numerals identify corresponding or like components.

In the drawings.

DETAILED DESCRIPTION OF THE DRAWINGS

Figure 1:
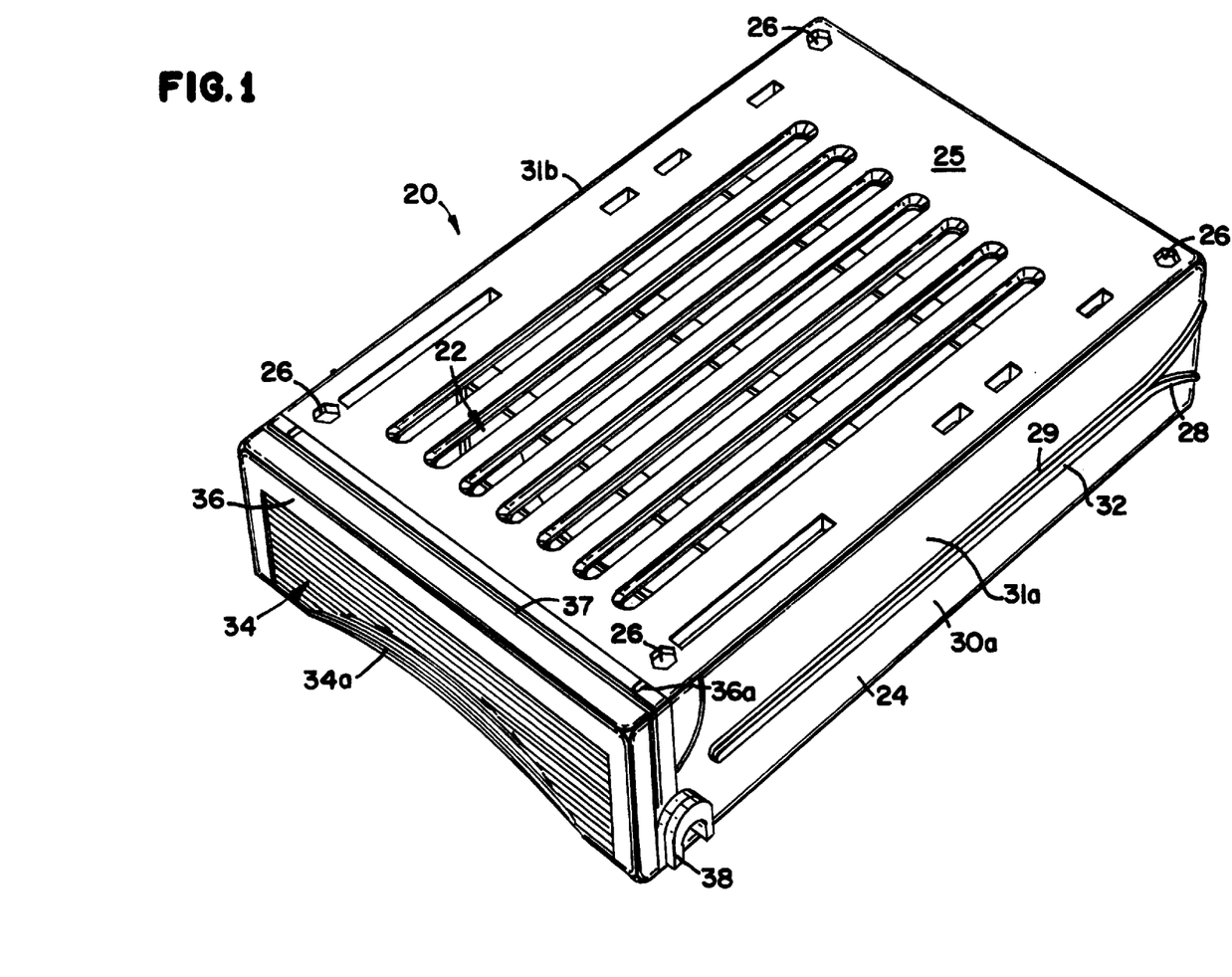
FIG. 1 is a perspective view of the exterior of the system of the present invention.

FIG. 1 shows the shuttle 20 of the mounting system of the present invention in use with a computer module 22, such as a drive (e.g., disk, hard, compact disk, tape, etc.), tape backup or other similar backup device, or the like. The shuttle 20 is formed of a lower or base member 24 and an upper or cover member 25, these members 24, 25 fit together in a tight aesthetic fit. The members 24, 25 are secured by screws (not shown) placed into threaded columns 26, that extend through both members 24, 25. Additional securement with adhesives or other mechanical fasteners is also permissible. The shuttle 20 is constructed and dimensioned to accommodate the module 22, sought to be mounted by the system of the present invention, while fitting within a standard space within a computer (computer structure) 40 (FIG. 2), or the like (detailed below).

Each member 24, 25 includes protruding rails 28, 29 (only one shown for each member 24, 25) on oppositely disposed sides 30a, 30b (FIG. 3), 31a, 31b of each member 24, 25, forming a groove 32 therebetween. The lower member 24 may also include a cover 34 (with indentations 34a) attached thereto by conventional mechanisms, and a handle 36 pivotally attached to the cover 34 by conventional mechanisms. The handle 36 is retained on the cover 34 by a closure mechanism 37, opened to permit downward pivoting of the handle 36 by pressing the handle 36 inward toward the cover 34. The handle 36 may include extensions 38, for example, in an inverted "U" shape, protruding from each side of the handle 36.

Figure 2:
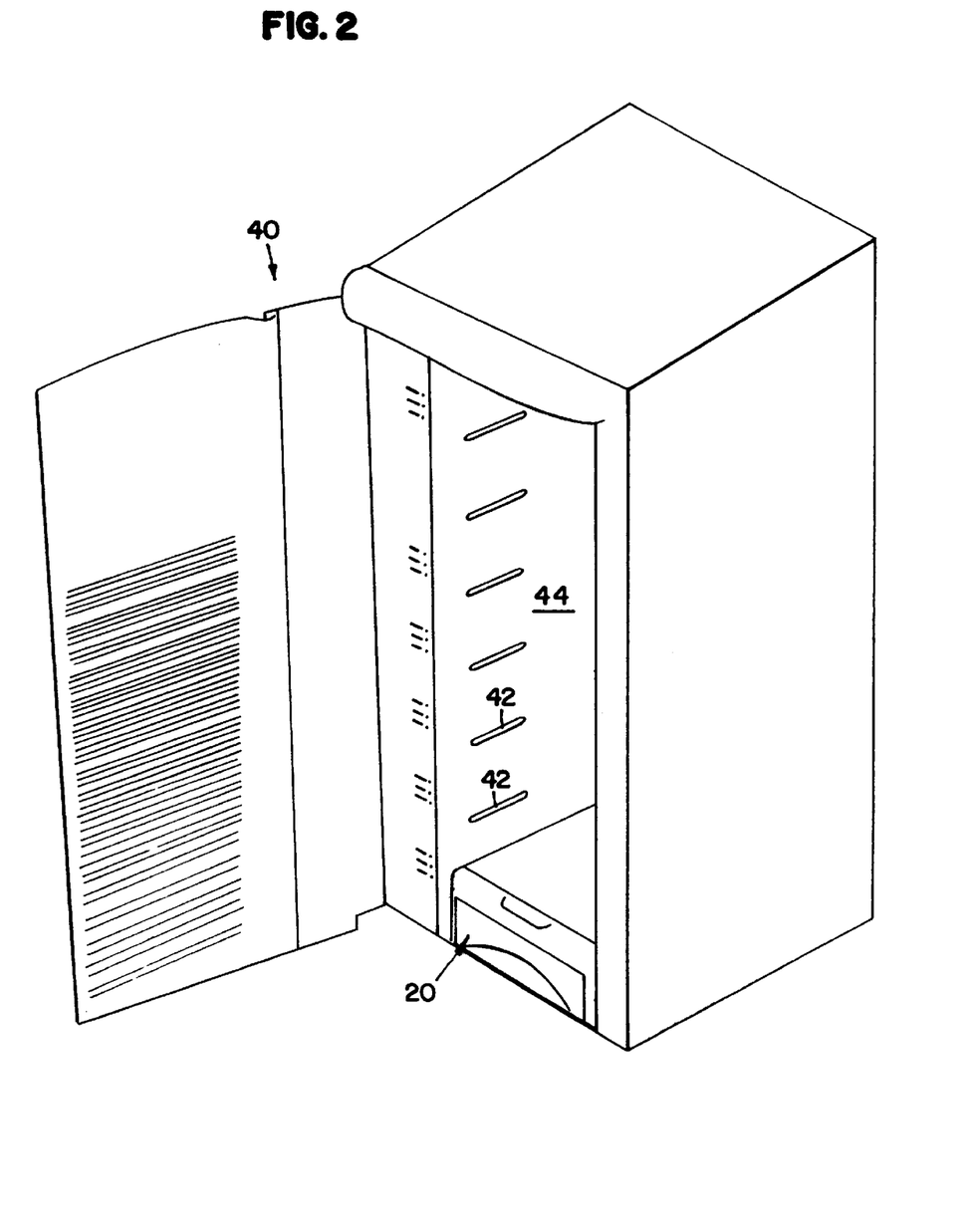
FIG. 2 is a front perspective view of the present invention as mounted in a computer structure.

As shown in FIG. 2, when mounting of the shuttle 20 is desired in a computer 40, the grooves 32 (FIG. 1) receive members 42 protruding from a frame 44 chassis or the like. Additionally, the extensions 38 engage rods (not shown), that may be outwardly extending screws, bolts or the like, extending from the frame or chassis portion. The shuttle 20 can also be attached to the computer frame, chassis or the like by conventional mounting hardware.

Figure 3:
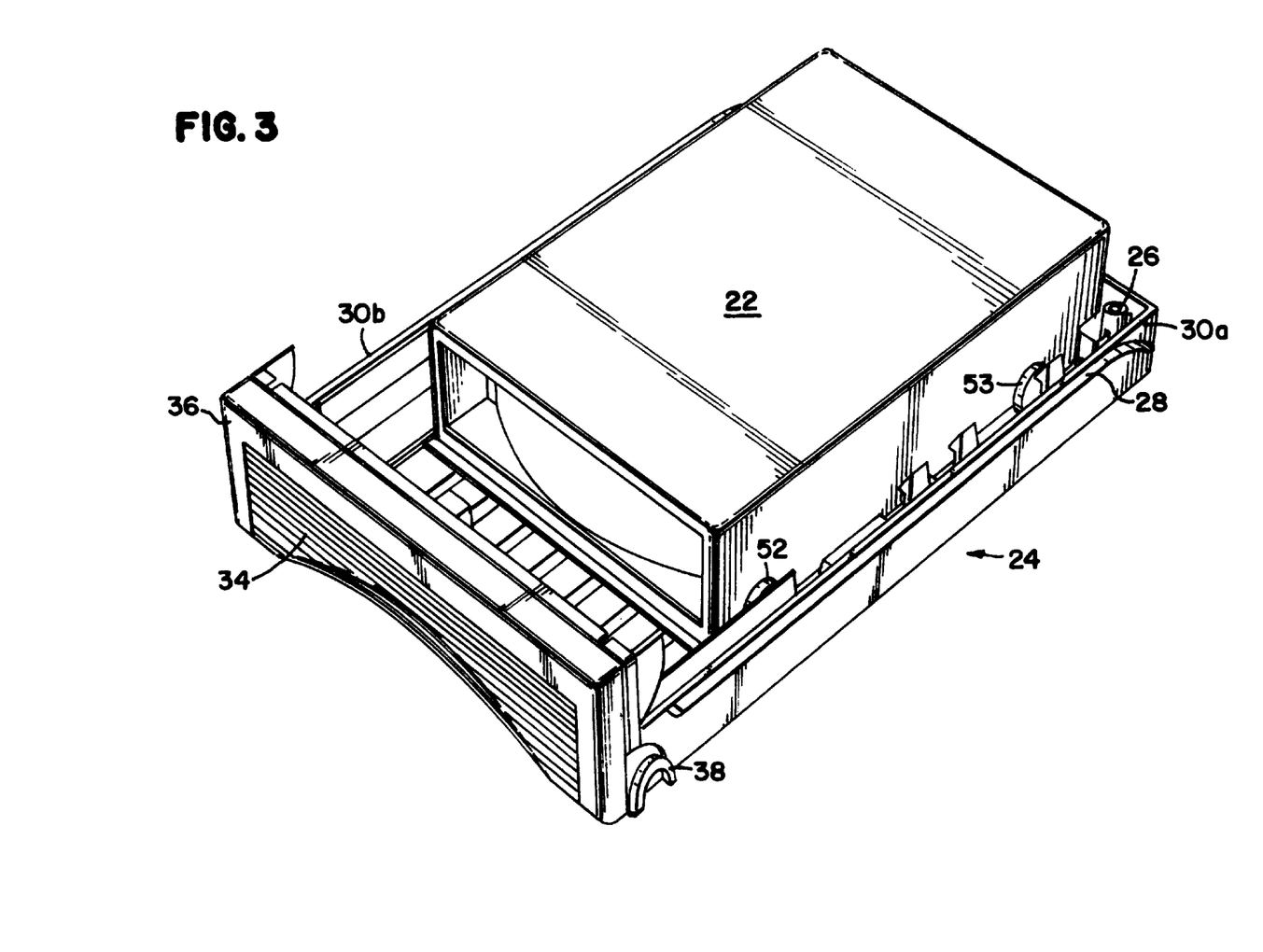
FIG. 3 is a perspective view of a computer module in use with the system of the present invention, with the upper member removed.
Figure 4:
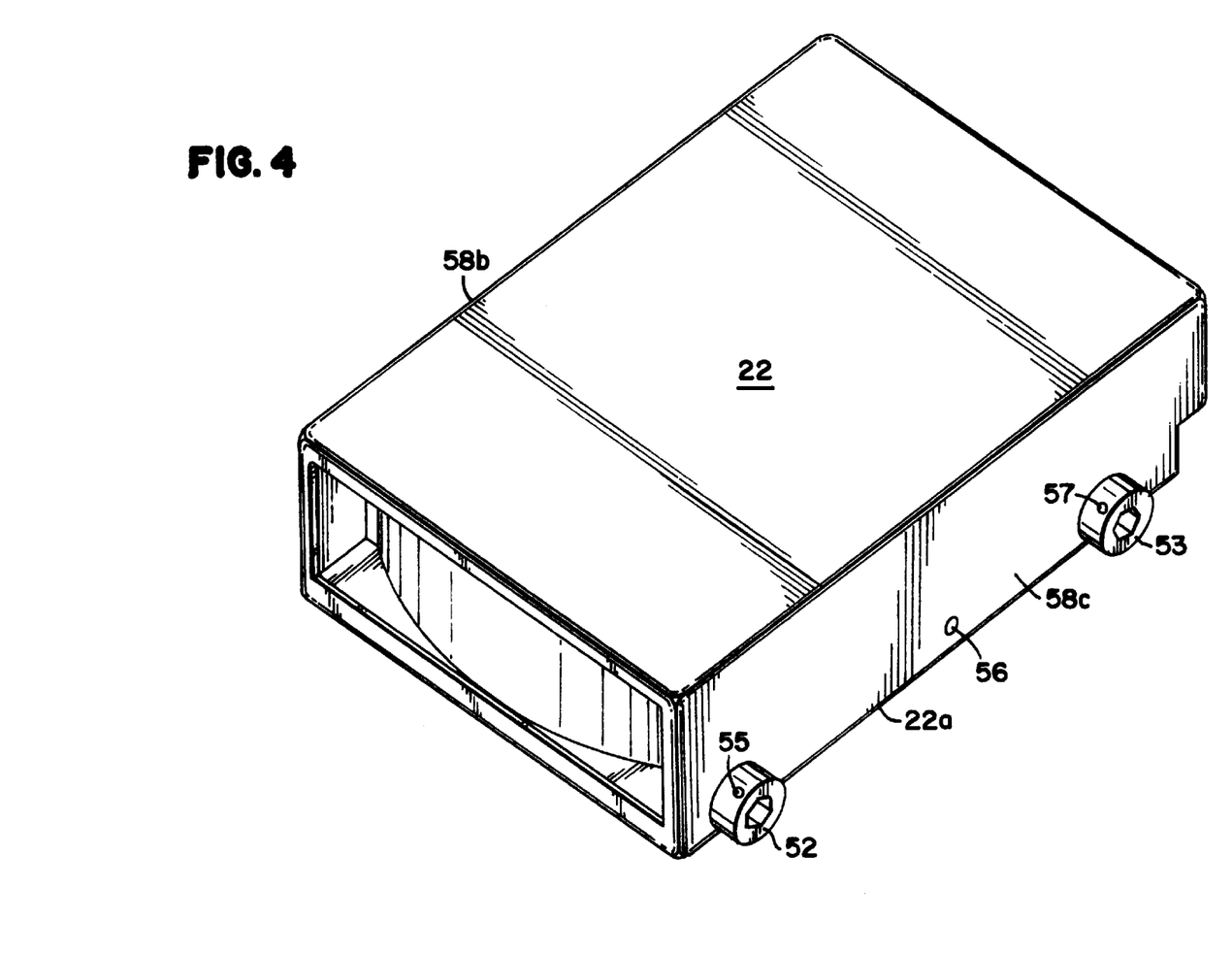
FIG. 4 is a view of a computer module in use with a portion of the system of the present invention.

FIGS. 3 and 4 show the computer module 22 in operation with the mounting system of the present invention. The system also includes paired front guides 52 and paired rear guides 53 (only one guide of each pair shown). One guide 52, 53 from each guide pair attaching to openings 55, 56, 57 (FIG. 4), on the respective opposite sides 58a, 58b (FIG. 4) of the module 22. The module 22 mounts in the shuttle 20, as the paired front and rear guides 52, 53 are engaged in the lower member 24 of the shuttle 20.

The guides 52, 53 fit into respective openings 55, 57 in the module 22 by screw-type attachments, male-female friction fits, or the like. These openings 55, 57 (and also opening 56) are typically industry standard, provided by the module manufacturer in accordance with standard industry specifications, for other attachment hardware. However, other similar openings could be made in the module 22 if desired, such that the module 22 can be used in accordance with the present invention. It is preferred that there be at least two pairs of guides 52, 53 (one for resting along the reduced portion 84 shown in FIG. 6 of the track 80 and the other for resting in a well 87 along the track 80, as detailed below). Three or more guide pairs are also permissible, in either the existing (manufacturer provided openings), or added openings.

It is preferred that each of the guides 52, 53 be identical and of a diameter such that at least a portion of each guide 52, 53, extends below the plane of the lower surface 22a of the module 22. The guides 52, 53 need not be identical, but should all have diameters sufficient so that each guide 52, 53 extends below the plane of the lower surface 22a of the module 22 when providing shock mounting for the module 22, when placed onto a surface, such as a table or desk top or the like (the module 22 separate from or within the shuttle 20 or the lower member 24).

Figure 5:
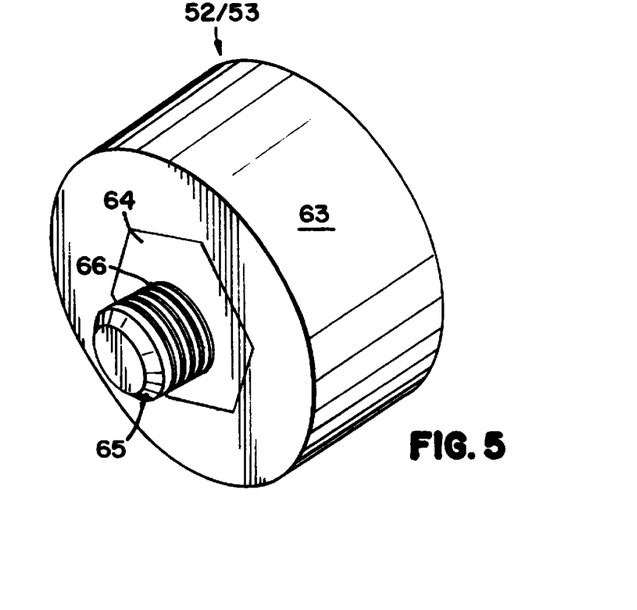
FIG. 5 is a perspective view of a portion of the system of the present invention.

As shown in FIG. 5, the guides 52, 53 include an outer member 63, preferably circular or rounded, that surrounds a hub 64. The hub 64 includes a central stem 65, preferably with a threaded surface 66, extending from the hub 64. The hub 64 and central stem 65 are preferably unitary, as a conventional bolt or the like, but could be of separate pieces attached together by conventional fastening techniques. The threaded surface 66 of the central stem 65 serves as a screw, and thus the guides 52, 53 can be attached to the body of the module 22 at the openings 55, 56, 57, similar to that of conventional screws. The outer member 63 is typically attached to the hub 64 by being molded thereon. Alternately, the outer member 63 could attach to the hub 64 by mechanical attachments, adhesives, combinations thereof, or the like. The outer member 63 may be made of a hard plastic or the like, when a standard module mounting is desired. When shock and vibration protection is desired for the module 22, such that the module 22 is "shock mounted", the outer member 63 is made of a shock absorbing material, such as an elastomer, rubber, soft plastic, or the like, and/or combinations or mixtures thereof.

Alternatively rounded outer members 63 could include ovals, and other outer member shapes may include square, rectangular, triangular or combinations of these shapes. Additionally, the hub 64 need not be present at all, as a central stem 65 could be mounted directly in the member 63 (shaped to occupy the volume of the former hub) by the attachments described above. Alternatively, the guides 52, 53 could be one-piece members formed entirely of the material used to make the outer member 63, by methods including blow molding, injection molding, extrusion or the like. The outer member 63, hub 64 and central stems 65 forming the guides 52, 53 could also be configured to allow for the outer member 63 to be rotatable with respect to the central stem 65 (serving as an axis) in a wheel-like manner.

Figure 6:
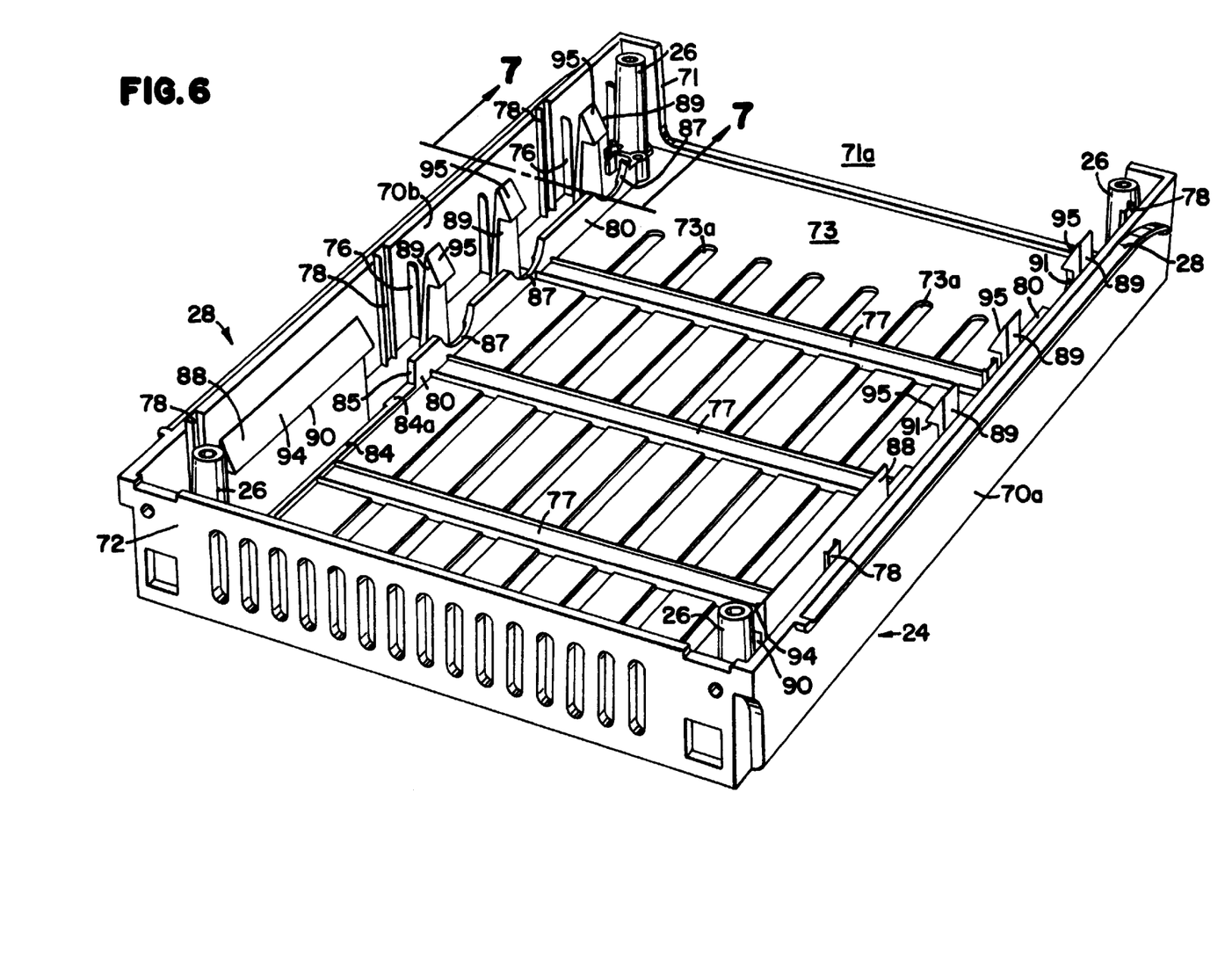
FIG. 6 is a perspective view of the lower member of the shuttle of the present invention.
Figure 7:
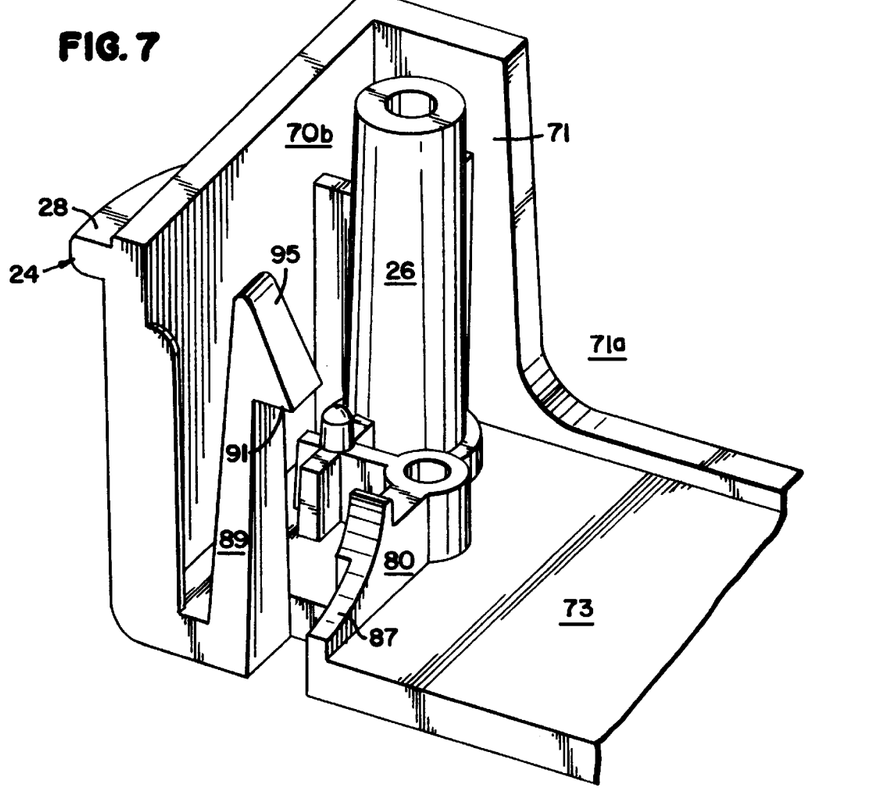
FIG. 7 is a cross sectional view along line 7—7 of FIG. 6.

Turning also to FIGS. 6 and 7, the lower shuttle member 24 is a tray-like structure, having lateral walls 70a, 70b, a rear wall 71, preferably including an open area 71a to accommodate electronic connections, a front wall 72, preferably formed by a vent plate, and a floor 73, preferably including openings 73a or vents. The floor 73 extends along a plane substantially parallel, and preferably parallel, to the horizontal plane. This shuttle member 24, both alone and in combination with upper shuttle member 25, is dimensioned to fit within a standard bay or bays of the computer chassis or frame (as detailed above) or other structural portion of the computer. There are preferably vertical reinforcing ribs 76 along the lateral walls 70a, 70b, and horizontal reinforcing ribs 77 along the floor 73, for providing additional strength to the shuttle member 24. Columns 26 that receive screws or the like, extend from the floor, at points along the shuttle member 24, preferably proximate the corners, although other locations, as well as more or fewer columns are also permissible. Bars 78 may extend along the lateral walls 70a, 70b to a point above the member 24, to assist in alignment of the lower and upper members 24, 25, when attachment is desired.

Tracks 80 (see also FIG. 3) are disposed along opposite sides of the shuttle member 24. Each of the tracks 80 includes a reduced portion 84 at their front, that terminates in an upwardly extending lip 85, for receiving the respective front guide 52, and rearwardly positioned wells 87, designed to receive the respective rear guide 53. The reduced portion 84 and the wells 87 are positioned on the track 80 at locations corresponding to possible positions for the guides 52, 53, as would be mounted to the module 22, having openings positioned according to industry standards, that would accommodate the guides 52, 53 in most industry standard combinations. It is preferred that the reduced portion 84 and wells 87 have their lowest points (lowermost points of the reduced portion 84 along the lowermost surface thereof) coplanar, this plane being substantially parallel to the plane formed by the shuttle floor 73, in order to keep the module 22 level in the computer. It is also preferred that the wells 87 be semicircular in shape, with radii of curvature slightly greater than the radii of curvature for the guides 52, 53, preferably corresponding to guide shape, for accommodating the guides 52, 53 in a secure manner. However, other shapes, such as elliptical, triangular, curved, square, rectangular, or combinations thereof for the wells 87 are also permissible.

Latches 88, 89 extend upward from the floor 73 of the lower shuttle member 24, from outside of the tracks 80, at positions corresponding to the reduced portions 84 and the wells 87, respectively. These latches 88, 89 are designed to be resiliently deformable, for exhibiting spring-like behavior, in assisting the engagement of the respective guides 52, 53 that are received on the reduced portions 84 and in the respective well 87 upon module 22 installation (detailed below). The latches 88, 89 include flanges 90, 91, that serve as an upper boundary for assisting in the engagement and retention of the respective guides 52, 53 in the respective reduced portions 84 and wells 87 (the reduced portions 84 and wells 87 along the respective track 80 serving as the lower boundary). The flanges 90, 91 extend to a height just slightly greater than the diameter of the guides 52, 53 as measured from the lowest point of the respective reduced portion 84 and well 87, and need only extend such that a portion of each flange 90, 91 be over at least a portion of the guide, although it is preferred that at least a portion of the flange 90, 91 extend over the respective track 80. The latches 88, 89 may include heads 94, 95 that protrude inward (preferably triangular in cross section) to assist in the deformation of the latches, during module 22 installation and removal, with respect to the shuttle member 24 (detailed below). For example, this shape enables outward movement of the latches 88, 89 when pushed downward by contact with the guides 52, 53, or when pulled outward manually. However, other shapes for the heads 94, 95, such as square rounded or the like are also permissible. The heads 94, 95 may include slots or indentations therein, for manual gripping with a finger, tool or the like.

If desired, the reduced portion latches 88 may be decreased in length. Regardless of length, it is preferred to position these reduced portion latches 88 so that a segment 84a of the reduced portion 84, before the lip 85, is not covered by the latch 88. This segment 84a is at least just slightly longer than the diameter of the guide 52, for assisting in the placement and removal of the module 22 with respect to the shuttle member 24 (detailed below). Alternatively, these reduced portion latches 88 may be eliminated altogether.

While three pairs of well latches 89 are shown in FIG. 6, only a single pair of well latches 89 (one per track 80) needs to be employed (in combination with the respective oppositely disposed wells 87), as shown in the drawing figures, for engaging the oppositely disposed pair of rear guides 53. Moreover, at minimum, only a single well latch 89 on only one track 80 need be present for proper operation of the system of the present invention.

It is preferred that the shuttle member 24 be made of a resilient polymeric material such as plastics, for example polyethylene, polypropylene, polyurethane, ABS, LEXAN® (General Electric Company, Pittsfield, Mass.), or the like, and as a unitary piece, by techniques such as injection molding, blow molding, extrusion, or the like. However, multiple pieces for this member 24 are also acceptable. This resilient polymeric material allows the latches 88, 89 to exhibit the desired spring-like behavior for engaging the front 52 and rear 53 guides (when they rest in the respective oppositely disposed reduced portions 84 and oppositely disposed wells 87) in a snap-like manner. Additionally, the polymeric material can be impregnated with electrically conductive particles, for noise reduction. It is also permissible to use wood or metal (e.g., sheet metal) alone, in combination, or in combinations with the polymeric material (with or without the electrically conductive particles), for this shuttle member 24.

Figure 8:
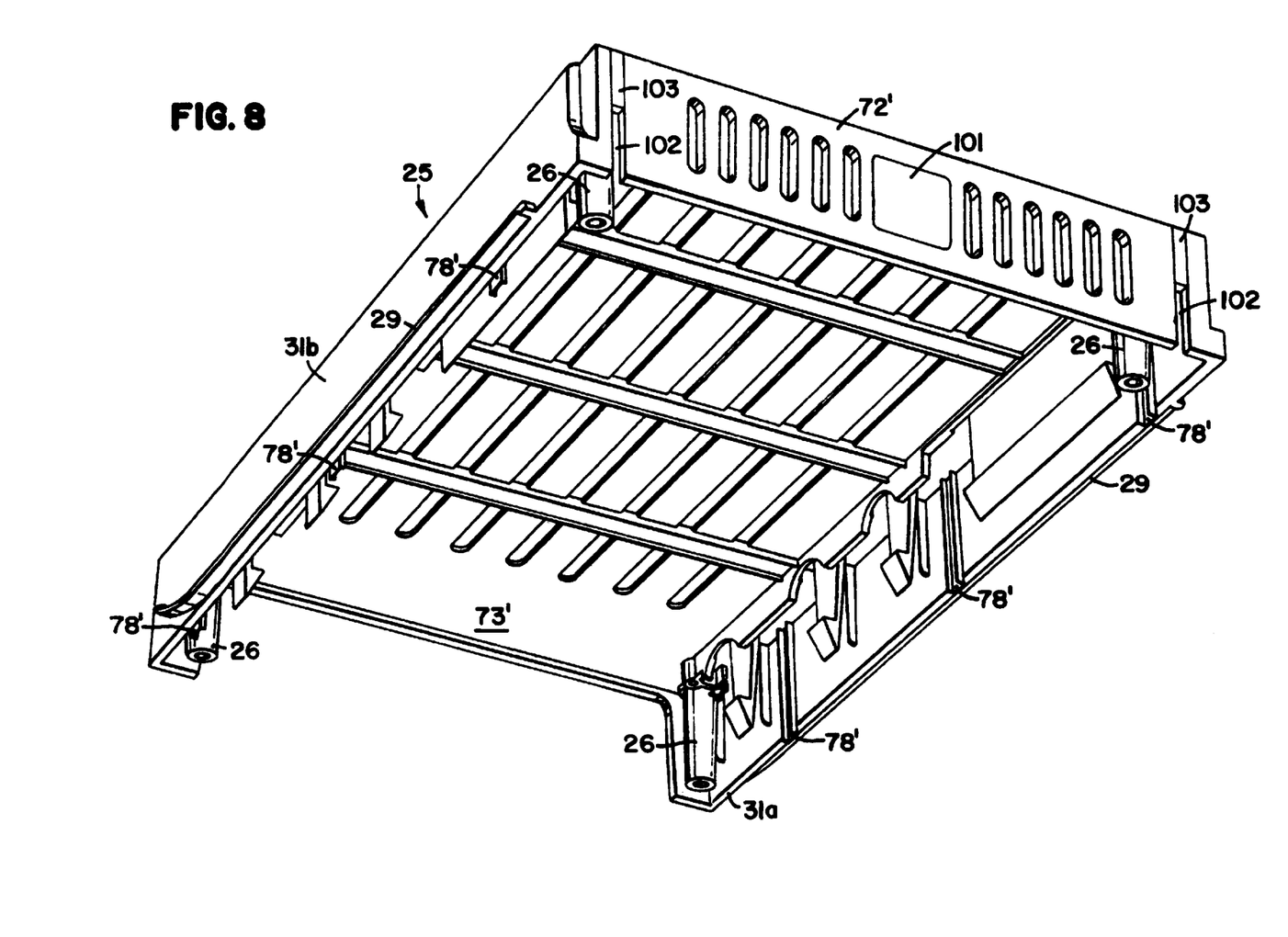
FIG. 8 is a perspective view of the upper member of the shuttle of the present invention.

FIG. 8 shows the upper shuttle member 25 in detail. This member 25 is identical in all aspects of construction, materials, and dimensions, to the lower shuttle member 24, except where specifically noted. This upper shuttle member 25 is designed to be used as a cover for the module 22, and thus, is the lower shuttle member 24 in an inverted orientation. (Accordingly, floor 73 in the lower shuttle member is a ceiling 73'). The front wall 72' differs from corresponding front wall 72 on the lower member 24, in that it includes a central opening 101, for accommodating a closure mechanism 37 (FIG. 1), slits 102 and protruding nubs 103 for engaging and aligning with the corresponding indentations 34a on the cover 34 (FIG. 1). Additionally, the tracks 80 and latches 88, 89 may be eliminated if desired. Also, the bars 78' are identical in construction and function as the bars 78 on the lower member 24, but are at different positions (on each lateral side) than the bars 78, to properly assist in the alignment of the members 24, 25 in forming a tight, aesthetic fit thereof, when attachment is desired.

The shuttle members 24, 25 shown are universal, as the reduced portions 84, reduced portion latches 88, and three wells 87 per track 80 with corresponding well latches 89, are positioned in accordance with industry standard openings on conventional modules (detailed above), these openings (for example, openings 55, 56, 57, detailed above) corresponding to guide positions. Accordingly, this significantly reduces the need to make different shuttles with specific reduced portion latches 88 and only a single well and corresponding well latch per track, for specific guide locations. However, alternate shuttles are possible in accordance with the present invention, as are custom shuttles and/or shuttle members, with different reduced portion/latch and well/latch positions, having with single or multiple wells/latches per track, at any desired position, to receive guides custom fitted onto other modules.

While it is preferred to use both shuttle members 24, 25 to enclose the module 22, when mounting in the computer 40 is desired, the lower shuttle member 24, can perform this function alone. Accordingly, grooves 32 would be formed on opposite sides 30a, 30b of the shuttle member 24, by structures identical or similar to the rails 28, 29, detailed above, or other equivalent structures designed to engage the protruding members 42 on the computer chassis or frame. Alternatively, the shuttle member 24, preferably at the sides 30a, 30b, could be adapted to include conventional mounting hardware for connecting to the computer chassis or frame.

In accordance with the present invention, this system can be mounted easily with two hands. Initially, the module 22 is prepared as the paired guides 52, 53 are placed onto the module 22, preferably at the manufacturer placed openings, as the guides 52, 53 (by their central stems 65) are rotated in a screw-like manner. Specifically, a first hand holds the lower shuttle member 24. A second hand grips the module 22 and slides it into the shuttle member 24 in the rearward and/or downward directions, with the latches 89 resiliently deforming outward. Sliding continues until the rear pair of guides 53 rest within their respective wells 87, with the latches 89 snapping inward over the guides 53, retaining them in place. The front portion of the module 22 is now pushed downward, with the guides 52 against the heads 94, the pushing coupled with the head shape, such that the latches 88 resiliently deform outward. Downward pushing continues until the front pair of guides 52 rests along the reduced portions 84 of the tracks 80, and the latches 88 snap back (inward), such that guides 52 are bounded along their upper sides by the flanges 90 of the latch 88. The rear wall 71 serves as an ultimate limit for rearward movement of the module 22.

The upper shuttle member 25 is placed over the lower shuttle member 24, and aligned therewith such that the screw columns 26 on each member 24, 25 are aligned. Once aligned, screws are placed into these columns and adjusted such that the shuttle members 24, 25 are attached, forming the shuttle 20.

The now formed shuttle 20 (containing the module 22) can be held in one hand and placed into a computer 40, by placing the grooves 32 onto alignment with the protruding members 42 in the computer chassis, frame, or the like. Once an engagement has been made, the shuttle 20 is slid rearward, to the position shown in FIG. 2.

Alternatively, the upper member 25 needs not be used at all. In this case, the module 22 is fitted with guides 52, 53, as above, and slid into the shuttle member 24 in accordance with that described above. The shuttle member 24 can be held in one hand and slid into the computer 40, such that the grooves into alignment with the protruding members 42 in the computer chassis, frame or the like. Once engagement is made, the shuttle member 24 is slid rearward, to a position similar to that shown in FIG. 2. In the case of the shuttle member 24 not having grooves, it can be mounted by conventional mounting hardware.

Should removal of the module 22, or alternatively, removal of the shuttle 20 or shuttle member 24 having the module 22 therein, be desired, for placement on a table top or the like, the computer 40 needs only be accessed and the shuttle handle 36 pressed rearward, for the closure mechanism 37 to release, releasing the handle 36. The handle 36 is then pivoted downward and pulled forward. A gentle pulling action allows for sliding of the shuttle 20, or shuttle member 24 (if only the lower shuttle member 24 is used), that is ultimately removed from the computer 40 by this sliding. The shuttle members 24, 25 may now be separated, by unscrewing the screws (if both shuttle members 24, 25 are used).

The module 22 can now be removed from the lower shuttle member 24. One way of performing this step initially involves manually deforming the well latches 89 outward. This is followed by pulling the rear of the module upward, such that the guides 53, clear the well latches 89. The module 22 can then be slid rearward, such that the guides 52 rest against the lips 85, clearing the reduced portion latches 88. The module 22 is pulled upward, such that it is now separate from the shuttle member 24.

Alternatively, should a single shuttle member 24 be used with conventional mounting hardware, the hardware would have to be disassembled prior to the shuttle member 24 being removed from the computer. Moreover, in cases where only the lower shuttle member 24 is used, the module 22 can be removed directly, if desired, in accordance with the module removal procedure described above.

While the invention has been described in connection with an embodiment, it will be understood that the invention is not limited to that embodiment. The invention is intended to cover all alternatives, modifications and equivalents as may be included within the spirit and scope thereof, as defined by the appended claims.

What is claimed is:

1. A system for mounting a computer module in a computer structure, comprising:
   a plurality of guides for attaching to said computer module; and
   a shuttle for receiving said computer module, said shuttle comprising:
      a floor, at least one releasable lock extended upwardly from said floor and disposed along the longitudinal track to engage and retain at least one of the plurality of said guides in the at least one longitudinal track; and
      means for coupling with a predetermined structure in said computer structure, and for mounting said shuttle in said computer structure.

2. The system of claim 1, wherein said shuttle comprises at least two members.

3. The system of claim 2, wherein said at least two members include a first member and a second member.

4. The system of claim 3, wherein at least one of said first or second shuttle members includes said means for receiving and retaining at least one of said plurality of said guides.

5. The system of claim 4, wherein said means for receiving and retaining at least one of said plurality of said guides include at least one portion for receiving said guide in operative communication with a latching member.

6. The system of claim 5, wherein said plurality of guides includes at least two pairs of guides, one of said pairs defining a first pair and one of said pairs defining a second pair, each guide of said guide pair being oppositely disposed from the other when attached to said computer module; and
   said at least one portion for receiving said guide in operative communication with a latching member includes at least a first pair and a second pair of oppositely disposed portions in operative communication with a latching member, said portions for receiving said guide in operative communication with a latching member positioned on said shuttle member in an arrangement where the first and second pairs of oppositely disposed portions in operative communication with a latching member correspond to the respective positions of said first and second pairs of guides on said computer module.

7. The system of claim 6, wherein said at least one shuttle member includes at least two oppositely disposed longitudinal tracks, each of said longitudinal tracks including:
   a reduced portion, said reduced portion on each of said longitudinal tracks defining said first pair of oppositely disposed portions; and
   a well, corresponding configured with respect to the shape of said guide, said well on each of said longitudinal tracks defining said second pair of oppositely disposed portions;
   wherein the guides are transversely, slidably receivable in the longitudinal tracks and are retainable in the wells.

8. The system of claim 7, wherein said floor defines a first plane.

9. The system of claim 8, wherein each of said wells terminates at a lowermost point and each of said reduced portions terminates along a lowermost surface, said lowermost points and lowermost surfaces defining a second plane, said second plane substantially parallel with said first plane, and said first plane is substantially parallel with the horizontal.

10. The system of claim 8, wherein said latch includes a flange defining an upper boundary for said guide and said well defines a lower boundary for said guide, for retaining said guide on said track.

11. The system of claim 1, wherein each guide of said plurality of guides extends beyond the lower surface of said module when attached to said module.

12. The system of claim 3, wherein said coupling means include oppositely disposed pairs of rails, one rail of each of said pair of rails along each of said first member and said second member, said rails on each of said members protruding therefrom and positioned to define a groove therebetween, said groove for engaging correspondingly positioned structure on said computer structure, for mounting said shuttle in said computer structure.

13. The system of claim 1, wherein said guides are rounded in shape.

14. The system of claim 13, wherein said guides are made from materials including plastic.

15. The system of claim 13, wherein said guides are made from materials including shock absorbing materials selected from the group consisting of: elastomers, rubbers, soft plastics, and at least two of elastomers, rubbers, soft plastics mixtures.

16. The system of claim 1, wherein said shuttle is made of a polymeric material.

17. A system for mounting a computer module in a computer structure, comprising:
 a plurality of guides for attaching to said computer module, the guides being made of a shock absorbing material; and
 a shuttle for receiving said computer module, said shuttle comprising:
  a floor;
  at least one longitudinal track disposed on said floor;
  at least one releasable lock disposed in the longitudinal track and extended upwardly from said floor to engage and retain at least one of said plurality of said guides in the at least one longitudinal track; and
  at least one coupler for mounting said shuttle in said computer structure.

18. The system of claim 17, wherein said shuttle comprises at least two members.

19. The system of claim 18, wherein said at least two members include a first member and a second member.

20. The system of claim 19, wherein at least one of said first or second shuttle members includes said at least one releasable lock.

21. The system of claim 20, wherein said at least one releasable lock includes at least one portion for receiving said guide in operative communication with a latching member.

22. The system of claim 21, wherein said plurality of guides includes at least two pairs of guides, one of said pairs defining a first pair and one of said pairs defining a second pair, each guide of said guide pair being oppositely disposed from the other when attached to said computer module; and
 said at least one portion for receiving said guide in operative communication with a latching member includes at least a first pair and a second pair of oppositely disposed portions in operative communication with a latching member, said portions for receiving said guide in operative communication with a latching member positioned on said shuttle member in an arrangement where the first and second pairs of oppositely disposed portions in operative communication with a latching member correspond to the respective positions of said first and second pairs of guides on said computer module.

23. The system of claim 22, wherein said at least one shuttle member includes at least two oppositely disposed longitudinal tracks, each of said longitudinal tracks including:
 a reduced portion, said reduced portion on each of said longitudinal tracks defining said first pair of oppositely disposed portions; and
 a well, corresponding configured with respect to the shape of said guide, said well on each of said longitudinal tracks defining said second pair of oppositely disposed portions;
 wherein the guides are transversely, slidably receivable in the longitudinal tracks and are retainable in the wells.

24. The system of claim 23, wherein said floor defines a first plane.

25. The system of claim 24, wherein each of said wells terminates at a lowermost point and each of said reduced portions terminates along a lowermost surface, said lowermost points and lowermost surfaces defining a second plane, said second plane substantially parallel with said first plane, and said first plane is substantially parallel with the horizontal.

26. The system of claim 24, wherein said latch includes a flange defining an upper boundary for said guide and said well defines a lower boundary for said guide, for retaining said guide on said track.

27. The system of claim 17, wherein each guide of said plurality of guides extends beyond the lower surface of said module when attached to said module.

28. The system of claim 19, wherein said at least one coupler includes two couplers, each of said couplers including oppositely disposed pairs of rails, one rail of each pair of rails along each of said first member and said second member, said rails on each of said members protruding therefrom and positioned to define a groove therebetween, said groove for engaging correspondingly positioned structure on said computer structure, for mounting said shuttle in said computer structure.

29. The system of claim 17, wherein said guides are rounded in shape.

30. The system of claim 29, wherein said guides are made from materials including plastic.

31. The system of claim 29, wherein said guides are made from materials including shock absorbing materials selected from the group consisting of: elastomers, rubbers, soft plastics, and at least two of elastomers, rubbers, soft plastics mixtures.

32. The system of claim 17, wherein said shuttle is made of a polymeric material.

33. A shuttle for mounting a computer module in a computer structure, said shuttle, comprising at least a first member, said first member including:
 a floor;
 at least one longitudinal track disposed on said floor; and
 at least one releasable lock disposed along the longitudinal track and extended upwardly from said floor to engage and retain at least one of a plurality of guides in the at least one longitudinal track, the guides for attaching to the computer module and made of a shock absorbing material.

34. The shuttle of claim 33, wherein said at least one first portion includes at least one pair of oppositely disposed first portions and said at least one second portion includes at least one pair of oppositely disposed second portions.

35. The shuttle of claim 33, further comprising:

said floor extending along a first plane;

at least two oppositely longitudinal tracks extending from said floor, each of said longitudinal tracks including:
 a reduced portion, said reduced portion being disposed on each of said longitudinal tracks; and
 a well, corresponding configured with respect to the shape of said guide, said well being disposed on each of said longitudinal tracks;
 wherein the guides are transversely, slidably receivable in the longitudinal tracks and are retainable in the wells.

36. The shuttle of claim 35, wherein each of said wells has a lowermost surface that is coplanar with a lowermost surface of each of said reduced portions along a plane, said plane substantially parallel to the horizontal.

37. The shuttle of claim 33, further comprising a second member.

38. The shuttle of claim 37, wherein said first member and said second member are correspondingly shaped along their edges for engaging each other.

39. The shuttle of claim 38, wherein each of said first and second members includes outwardly protruding rails disposed along opposite sides of each of said first member and said second member, said rails on each of said members positioned to define a groove therebetween, said groove for engaging correspondingly positioned structure on said computer structure, for mounting said shuttle in said computer structure.

40. A shuttle apparatus, comprising:
 a module having a plurality of guides attached to the module, the guides being made of a shock absorbing material; and
 a first member including a floor, a longitudinal track disposed on said floor and a latch member disposed along the longitudinal track and extended upwardly from said floor to releasably receive and retain the guides, the longitudinal track having a reduced portion and a well, the guides being transversely, slidably receivable and retainable in-between the reduced portion and the latch member.

41. A shuttle apparatus, comprising:
 a module having a plurality of guides attached to the module, the guides being made of a shock absorbing material; and
 a first member including a floor, a longitudinal track disposed on said floor and a latch member disposed along the longitudinal track and extended upwardly from said floor to releasably receive and retain the guides, the longitudinal track having a reduced portion and a well, the guides being transversely slidably receivable and retainable in-between the well and the latch member.

* * * * *